(12) United States Patent  
Hayashi

(10) Patent No.: US 10,297,528 B2  
(45) Date of Patent: May 21, 2019

(54) SEMICONDUCTOR MODULE

(71) Applicant: FUJI ELECTRIC CO., LTD., Kanagawa (JP)

(72) Inventor: Hideki Hayashi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 335 days.

(21) Appl. No.: 15/281,124

(22) Filed: Sep. 30, 2016

(65) Prior Publication Data

US 2017/0141012 A1 May 18, 2017

(30) Foreign Application Priority Data

Nov. 18, 2015 (JP) ................................. 2015-225555

(51) Int. Cl.
*H01L 23/48* (2006.01)
*H01L 23/40* (2006.01)
*H01L 23/02* (2006.01)

(52) U.S. Cl.
CPC .......... *H01L 23/4006* (2013.01); *H01L 23/02* (2013.01); *H01L 2023/405* (2013.01); *H01L 2023/4031* (2013.01); *H01L 2023/4087* (2013.01)

(58) Field of Classification Search
CPC ....... H01L 2023/4031; H01L 2023/405; H01L 2023/4087; H01L 23/4006; H01L 23/02; H01L 23/28; H01L 23/40; H01L 23/051; H01L 23/4334; H01L 23/3107
See application file for complete search history.

(56) References Cited

U.S. PATENT DOCUMENTS 6,160,710 A * 12/2000 Ahl ..................... H01L 23/4006  
257/727  
2010/0252922 A1 10/2010 Bayerer et al.

FOREIGN PATENT DOCUMENTS

JP 4685039 B2 5/2011

* cited by examiner

*Primary Examiner* — (Vikki) Hoa B Trinh

(57) ABSTRACT

A semiconductor module includes case that houses a semiconductor device therein and a fastener that is connected at one end thereof to the case. The fastener includes a first extending portion that is connected at one end hereof to the case and extends away from the case, and a second extending portion that is connected at one end thereof to the first extending portion and extends toward the case, where the second extending portion has a variable angle with respect to the first extending portion depending on an external force. The second extending portion has a through hole penetrating through the second extending portion from a front surface of the second extending portion to a back surface of the second extending portion; and a projection that is provided on the back surface of the second extending portion, the projection being positioned closer to the case than the through hole is.

14 Claims, 7 Drawing Sheets

SEMICONDUCTOR MODULE

The contents of the following Japanese patent application are incorporated herein by reference:
No. 2015-225555 filed on Nov. 18, 2015.

BACKGROUND

1. Technical Field

The present invention relates to a semiconductor module.

2. Related Art

In the conventional art, it is known to provide a fastener on the side surface of a package housing a semiconductor chip therein. The fastener is designed to secure the package onto a heat sink and the like (see, for example, Patent Document 1.) The package is secured onto the heat sink by using a screw or the like to secure the fastener to the heat sink. The related prior art documents include the following patent documents.

Patent Document 1: United States Patent Application Publication No. 2010/252922
Patent Document 2: Japanese Patent No. 4685039

It is preferable that the fastener is structurally difficult to be broken by an external force applied when the fastener is secured onto the heat sink or the like and is capable of pressing the package onto the heat sink or the like with a sufficient surface pressure.

SUMMARY

One aspect of the present invention may include a semiconductor module including a case that houses a semiconductor device therein and a fastener that is connected at one end thereof to the case. The fastener may include a first extending portion that is connected at one end hereof to the case and extends away from the case and a second extending portion that is connected at one end thereof to the first extending portion and extends toward the case, where the second extending portion has a variable angle with respect to the first extending portion depending on an external force. The second extending portion may have a through hole penetrating through the second extending portion from a front surface of the second extending portion to a back surface of the second extending portion. The second extending portion may have a projection that is provided on the back surface of the second extending portion, where the projection is positioned closer to the case than the through hole is.

The fastener may be provided on each of side surfaces of the case that oppose each other. The through hole may be spaced away from the projection. A case-side end of the second extending portion that is the closest to the case may be a free end. The projection may be provided on the case-side end of the second extending portion.

The fastener may have the first extending portion at each side of the second extending portion. An outer end of the second extending portion that is the most distant from the case may be connected to an outer end of the first extending portion at each side.

The fastener may further have a reinforcing portion at a connecting portion between the first extending portion and the second extending portion. The reinforcing portion may have a larger thickness than other portion of the fastener. The reinforcing portion may be provided at least in a partial region of the outer end of the first extending portion. The reinforcing portion may not be provided at least in a partial region of the outer end of the second extending portion.

A back surface of the fastener may be positioned between a front surface of the case and a back surface of the case. A tip of the projection may be positioned between the front surface of the case and the back surface of the case.

The first extending portion may be wider than the second extending portion. The first extending portion may be thicker than the second extending portion.

The semiconductor module may further include a heat sink that has the case placed thereon and a fixation element that penetrates through the through hole of the second extending portion and secures the second extending portion onto the heat sink.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
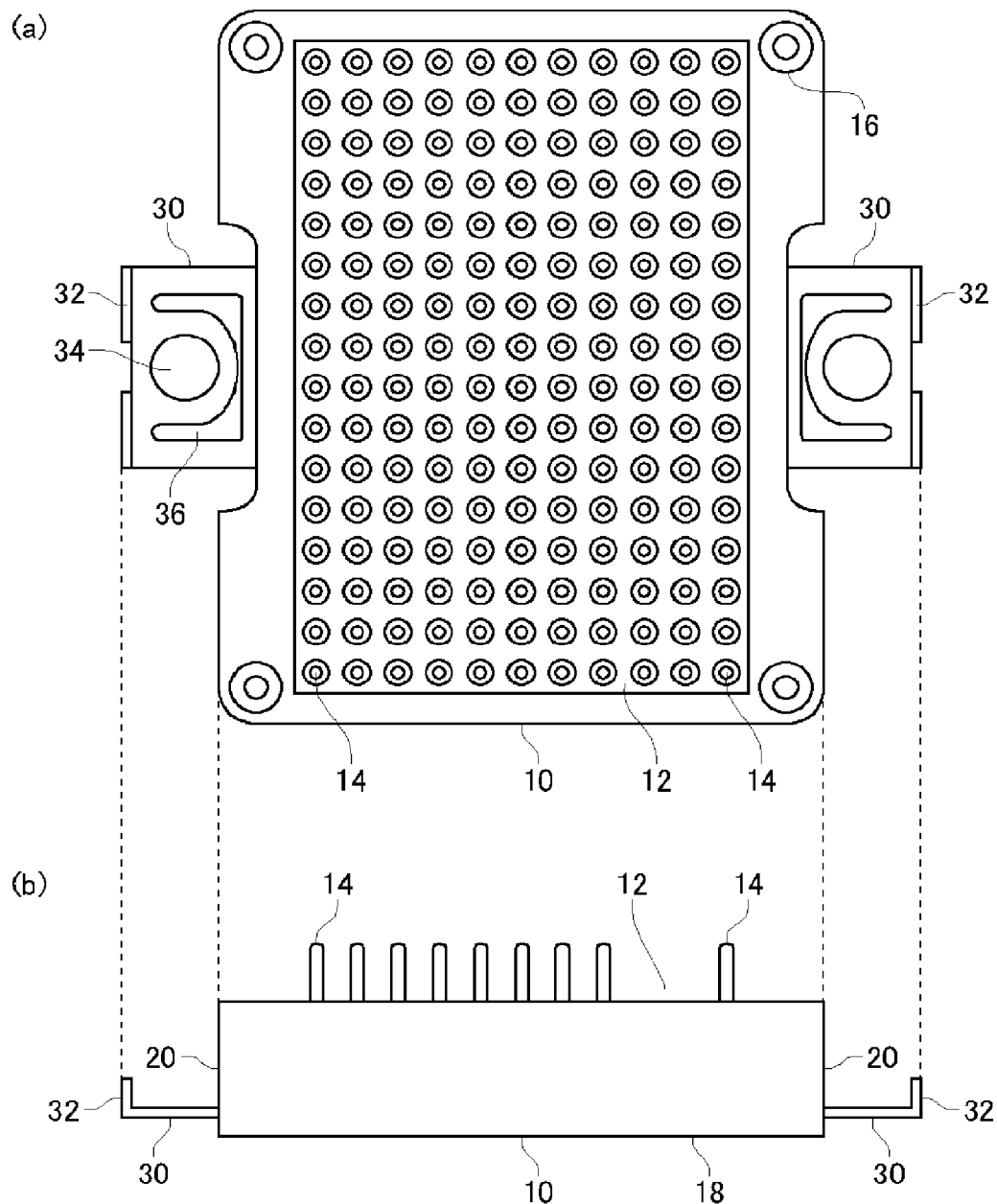
FIG. 1 shows an exemplary structure of a semiconductor module 100 relating to an embodiment of the present invention.

FIG. 1 shows an exemplary structure of a semiconductor module 100 relating to one embodiment of the present invention. In FIG. 1, (a) shows the front surface of the semiconductor module 100 and (b) shows the side surface of the semiconductor module 100.

The semiconductor module 100 includes a case 10, one or more terminals 14 and one or more fasteners 30. The case 10 houses therein a semiconductor device such as a semiconductor chip. In the present example, at least part of the case 10 is made of an insulative material such as a resin. The case 10 has a front surface 12, a back surface 18 and a plurality of side surfaces 20.

In the present example, the case 10 is generally shaped like a cuboid. Note that, however, the case 10 may have a curved or cut-out shape at the corners and any surface of the cuboid shape. Furthermore, holes 16 may be provided at the corners of the front surface of the case 10. In a case where the case 10 can be divided into a box portion and a lid portion, for example, the holes 16 receive screws to secure the box portion and the lid portion together.

In the present example, a plurality of terminals 14 are provided on the front surface 12 of the case 10. The terminals 14 are electrically connected to the semiconductor device housed in the case 10. The semiconductor device includes a semiconductor chip, an electrode pad, interconnections and the like. The terminals 14 are arranged in a predetermined manner on the front surface 12 of the case 10 depending on how the housed semiconductor device is arranged within the case 10. The terminals 14 may be inserted into at least some of the terminal holes uniformly arranged in the front surface 12 of the case 10.

In the present example, an insulative substrate is provided within the case 10 to have the semiconductor device placed thereon. The insulative substrate has electrically conductive layers formed on the both surfaces thereof. The electrically conductive layer on the front surface is patterned into a predetermined shape to serve as electrical interconnections. The electrically conductive layer on the back surface may be exposed through the back surface of the case 10. This electrically conductive layer may be thermally coupled to a heat sink or the like. In addition, within the case 10, a sealant such as a gel may be formed to seal the semiconductor device.

The fasteners 30 are each connected at one end thereof to the case 10. The fasteners 30 may be made of an electrically conductive material, an insulative material, or a combination of an electrically conductive material and an insulative material. If the fasteners 30 are made of an electrically conductive material, the fasteners 30 may be electrically connected to the interconnections and the like housed within the case 10 and serve as a ground terminal. In the present example, the fasteners 30 are provided on two side surfaces 20 of the case 10 opposing each other. The angle of at least a partial region of each fastener 30 with respect to the side surface 20 of the case 10 can be changed depending on an external force.

In the present example, the fasteners 30 can be bent in the height direction. In the present example, the height direction indicates the direction between the front surface 12 of the case 10 and the back surface 18 of the case 10 and is not always the same as the gravitational direction. The fasteners 30 may be shaped like a plate, made of a metal and provided to extend in the direction perpendicular to the side surface 20 of the case 10. The fasteners 30 may each have a secured end that is secured onto the side surface 20 of the case 10 and a free end that can be moved in the height direction.

The fasteners 30 each have a through hole 34 penetrating from the front surface to the back surface. The fasteners 30 are secured onto a heat sink or the like by inserting a fixation element such as a screw into the through hole 34. The fasteners 30 are at least partially bent by an external force such as a pressing force exerted by a screw. The fasteners 30 may be elastic enough to return to their original state from their bent state when the external force is removed.

Since the fasteners 30 are bent by an external force, the force exerted on the connected portion between the fasteners 30 and the case 10 can be reduced. Therefore, the connected portion between the fasteners 30 and the case 10 can be prevented from breaking even when a large external force is applied to the fasteners 30.

In the present example, the fasteners 30 may each have a reinforcing portion 32 at an end thereof that is opposite to the secured end thereof, which is secured onto the side surface 20 of the case 10. The reinforcing portion 32 has a larger thickness in the height direction than the other portion of the fastener 30. Also, the fasteners 30 each have a separation hole 36, by which a first extending portion and a second extending portion, described later, are separated from each other.

Figure 2:
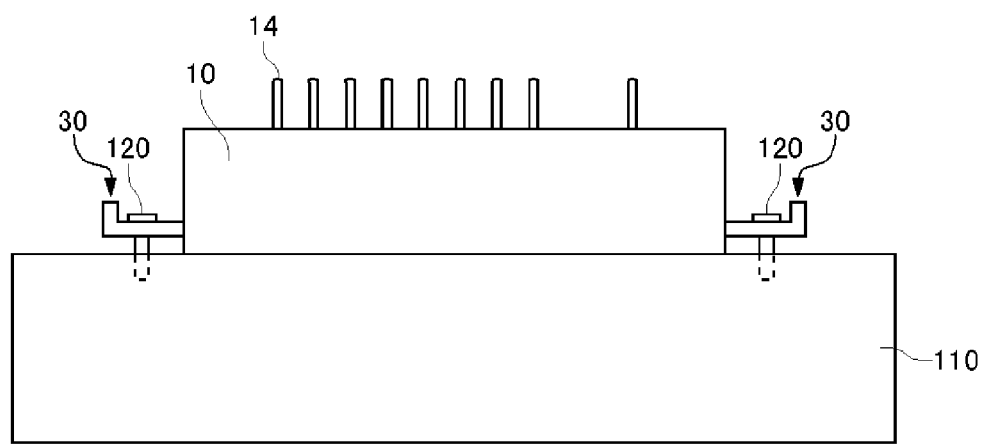
FIG. 2 is a side view showing the semiconductor module 100, which additionally includes a heat sink 110 and a fixation element 120.

FIG. 2 is a side view showing the semiconductor module 100, which additionally includes a heat sink 110 and a fixation element 120. As described above, the fixation element 120 is inserted into the through hole 34 provided in each fastener 30. In the present example, the fixation element 120 is a screw.

The fixation element 120 is connected to the heat sink 110. The fixation element 120 is connected by rotational movement or the like into the threaded hole provided in the heat sink 110 to press the fastener 30 against the heat sink 110. Between the case 10 and the heat sink 110, a thermal compound may be provided in order to improve heat dissipation.

The fasteners 30 preferably have spring properties. With such properties, the fasteners 30 can relax stress concentration and be prevented from breaking when secured onto the heat sink 110. If the fasteners 30 have spring properties, on the other hand, the case 10 may be pressed against the heat sink 110 at a lowered surface pressure. The lowered surface pressure lowers the wetness of the thermal compound at the connecting surface between the case 10 and the heat sink 110 and resultantly degrades heat dissipation.

Figure 3:
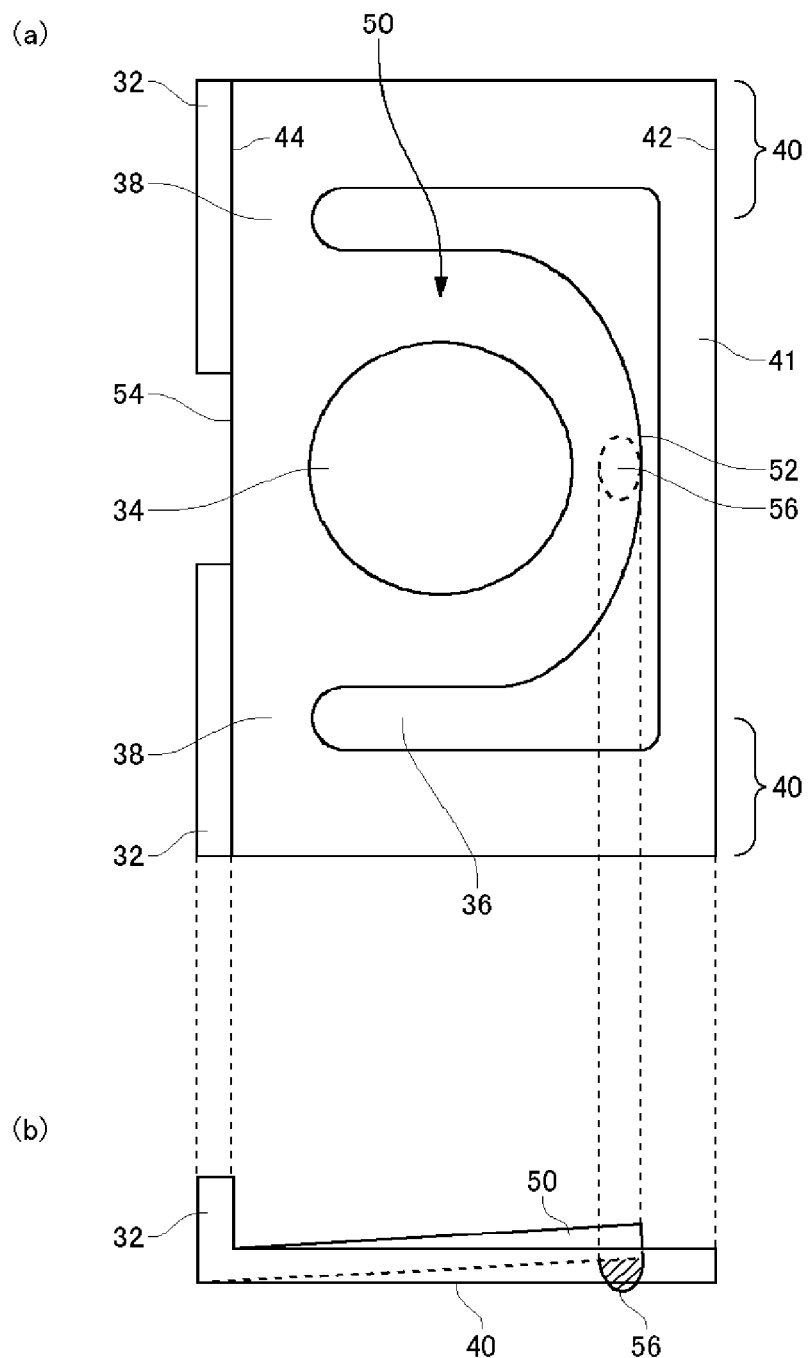
FIG. 3 shows an exemplary structure of a fastener 30.

FIG. 3 shows an exemplary structure of each fastener 30. In FIG. 3, (a) shows the front surface of the fastener 30, and (b) shows the side surface of the fastener 30. The fastener 30 includes first extending portions 40, a second extending portion 50, a case-side connecting portion 41 and outer connecting portions 38. The first extending portions 40, the second extending portion 50, the case-side connecting portion 41 and the outer connecting portions 38 may be integrally formed. The first and second extending portions 40 and 50 each have a case-side end and an outer end. The case-side end denotes the end of each extending portion that is the closest to the case 10, and the outer end denotes the end of each extending portion that is the most distant from the case 10.

The case-side end 42 of each of the first extending portions 40 is connected to the case 10. The first extending portion 40 extends from the case-side end 42 away from the case 10. The first extending portion 40 has an outer end 44 at the opposite end from the case-side end 42. The first extending portion 40 may be shaped like a plate extending from the case-side end 42 to the outer end 44. While no external force is applied, the front surface of the first extending portion 40 may be positioned parallel to the front surface 12 of the case 10.

In the present example, the fastener 30 has two first extending portions 40 that are parallel to each other at the same height. The case-side ends 42 of the two first extending portions 40 are connected to each other via the case-side connecting portion 41 that extends along the side surface of the case 10. The case-side connecting portion 41 may be secured onto the side surface of the case 10. The second extending portion 50 is arranged between the paired first extending portions 40.

The outer end 54 of the second extending portion 50 is connected to the outer ends 44 of the first extending portions 40, which are arranged at either side of the second extending portion 50. In the present example, the outer connecting portions 38 connect the outer end 54 of the second extending portion 50 to the outer ends 44 of the first extending portions 40. The second extending portion 50 extends from the outer end 54 toward the case 10. The region of the second extending portion 50 that extends toward the case 10 beyond the outer connecting portions 38 is surrounded by a separation hole 36. While no external force is applied, the second extending portion 50 may be positioned within a plane parallel to the first extending portions 40 or at an angle with respect to the first extending portions 40.

The second extending portion 50 has a through hole 34 penetrating therethrough from the front surface to the back surface. The through hole 34 may be shaped like a circle or other shapes. The second extending portion 50 is configured such that the angle of the second extending portion 50 with respect to the first extending portions 40 can vary depending on the external force applied by the fixation element 120 inserted into the through hole 34. The angle means the angle between the front surface of the first extending portion 40 and the front surface of the second extending portion 50, which can be observed when seen from the side surface of the fastener 30, as shown in FIG. 3 (b).

In the present example, the outer end 54 of the second extending portion 50 is connected to the first extending portions 40. The case-side end 52 of the second extending portion 50 is connected neither to the first extending portions 40 nor to the case-side connecting portion 41 and is thus a free end. Accordingly, the height of the portion of the second extending portion 50 that is positioned closer to the case-side connecting portion 41 varies depending on the external force applied in the direction from the front surface to the back surface.

The second extending portion 50 has a projection 56 on the back surface. The projection 56 is positioned closer to the case 10 than the through hole 34 is. The projection 56 is preferably spaced away from the through hole 34. More preferably, the projection 56 is positioned as distant as possible from the through hole 34. In the present example, the projection 56 is positioned at the case-side end 52 of the second extending portion 50.

The projection 56 may protrude beyond the back surface of the first extending portion 40 while no external force is applied. Alternatively, the projection 56 may not protrude beyond the back surface of the first extending portion 40 while no external force is applied. However, the second extending portion 50 is configured such that, at least while an external force is applied, the angle of the second extending portion 50 can vary depending on the external force in such a manner that the projection 56 protrudes beyond the back surface of the first extending portion 40.

The reinforcing portion 32 is at least partially provided on the outer connecting portions 38. In this way, the outer connecting portions 38, on which load is applied by a change in the angle of the second extending portion 50, can be prevented from breaking. In the present example, the reinforcing portion 32 is provided at the outer end of the fastener 30 and protrudes beyond the front surface of the fastener 30.

Each of the outer connecting portions 38 at the respective sides of the second extending portion 50 has a corresponding reinforcing portion 32. The outer connecting portions 38 are preferably separated away from each other. In the present example, each reinforcing portion 32 covers the entire outer end 44 of the first extending portion 40, the entire outer end of the outer connecting portion 38, and part of the outer end 54 of the second extending portion 50.

The reinforcing portion 32 may not cover at least part of the region of the outer end 54 of the second extending portion 50 that faces the through hole 34. The above-described structure can reinforce the outer connecting portions 38. In addition, the above-described structure can reduce the bending of the outer connecting portions 38 caused by the force exerted by the second extending portion 50 and allow the external force applied to the second extending portion 50 to be efficiently transferred to the first extending portions 40.

Figure 4:
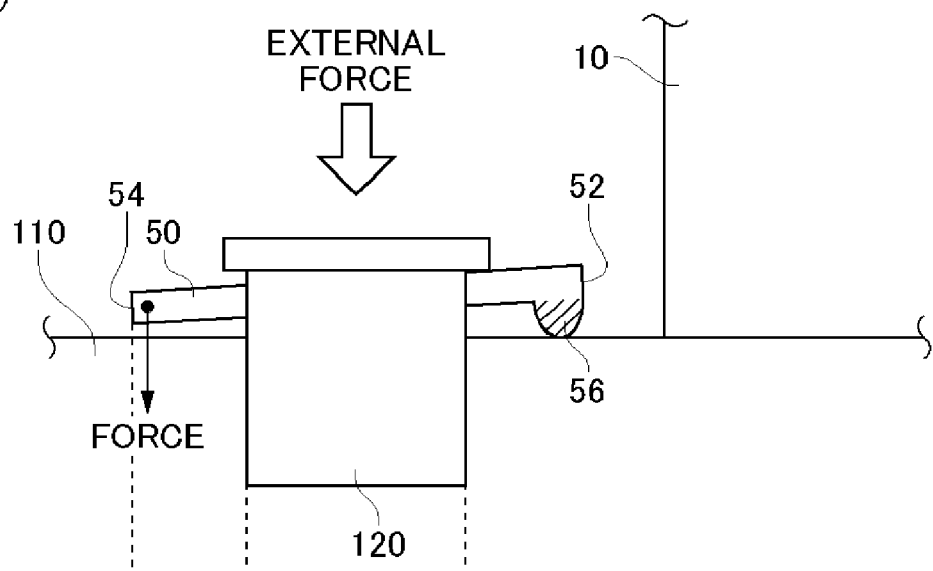
FIG. 4 is a side view showing the fastener 30, where a fixation element 120 has been inserted into a through hole 34.
Figure 4:
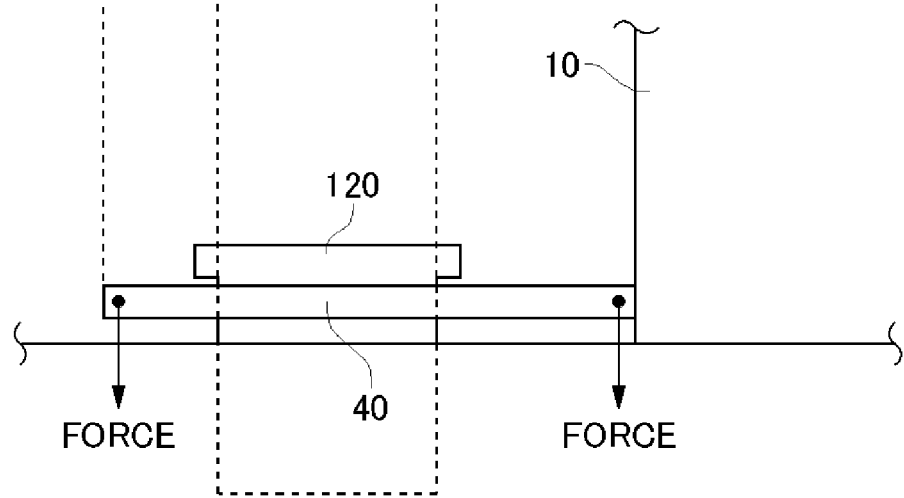

FIG. 4 is a side view showing the fastener 30, where the fixation element 120 is inserted into the through hole 34. In FIG. 4, (a) shows the second extending portion 50 and (b) shows the first extending portion 40. When pressed by the fixation element 120, the second extending portion 50 moves toward the front surface of the heat sink 110. Since the projection 56 is provided in the vicinity of the case-side end 52, the case-side end 52 stops when the projection 56 touches the front surface of the heat sink 110.

If the second extending portion 50 is further pressed by the fixation element 120 while the projection 56 is in contact with the heat sink 110, the outer end 54 attempts to move further toward the front surface of the heat sink 110. Here, the second extending portion 50 is preferably elastic to such an extent that the second extending portion 50 can be bent in a downward convex manner. For example, the region of the second extending portion 50 that protrudes beyond the outer connecting portion 38 toward the case 10 can be bent by an external force.

Since the outer end 54 of the second extending portion 50 is pressed downward, a downward force is also applied to the outer ends 44 of the first extending portions 40, which are connected to the outer end 54. Accordingly, the first extending portions 40 press the case 10 against the heat sink 110.

In the fastener 30 of the present example, the projection 56 is positioned closer to the case-side end 52 of the second extending portion 50 than the through hole 34 is. In this manner, the external force applied to the vicinity of the through hole 34, which is the point of effort, can be efficiently transferred to the case 10 via the projection 56, which is the fulcrum. For this reason, the surface pressure between the case 10 and the heat sink 110 can be maintained even if the fastener 30 has spring properties, and the heat dissipation properties can be preserved as the wetness of the thermal compound is maintained.

Furthermore, the first extending portions 40 and the second extending portion 50 extend in opposite directions. For this reason, the fastener 30 can achieve a compact size while an increased distance is accomplished on the first and second extending portions 40 and 50 between the projection 56 that is formed on the case-side end 52 of the second extending portion 50 (serving as the fulcrum in the lever) and the case 10 (serving as the point of application in the lever).

Figure 5:
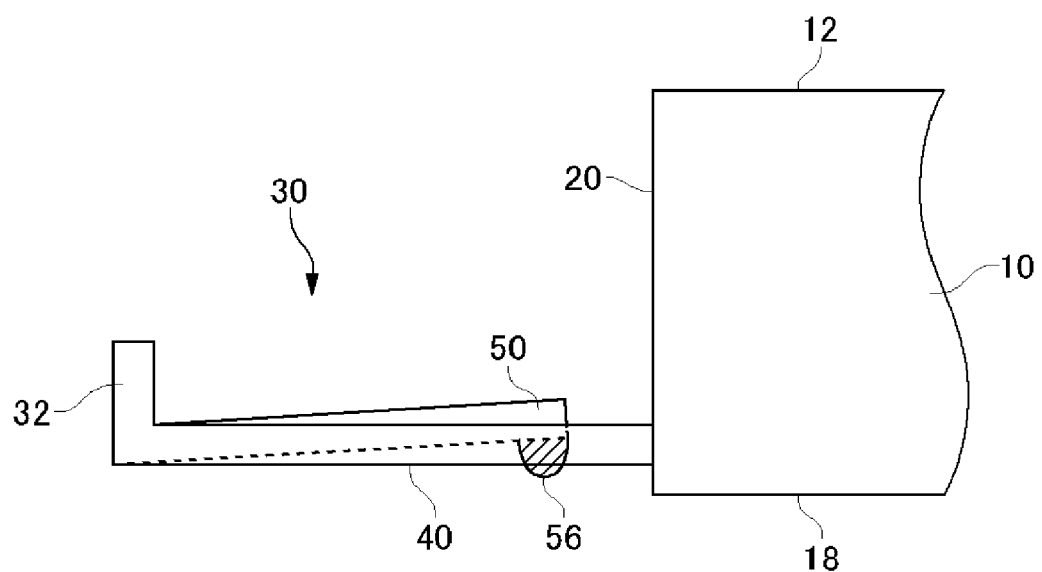
FIG. 5 is a side view showing the relative positions of the fastener 30 and a case 10, which are observed when no external force is applied.

FIG. 5 is a side view showing how the fastener 30 is positioned relative to the case 10 while no external force is applied. The back surface of the fastener 30 is positioned between the front surface 12 of the case 10 and the back surface 18 of the case 10. Note that the entire back surfaces of the first extending portions 40 and the entire back surface of the second extending portion 50 may be positioned between the front surface 12 of the case 10 and the back surface 18 of the case 10.

If the tip of the projection 56 protrudes beyond the back surface 18 of the case 10 while no external force is applied, the projection 56 is pushed upward when the case 10 is placed on the heat sink 110. This may create a force to lift up the case 10. To prevent this, the tip of the projection 56 may be also positioned between the front surface of the case 10 and the back surface of the case 10. Alternatively, the tip of the projection 56 may be positioned at the same level as the back surface 18 of the case 10.

Figure 6:
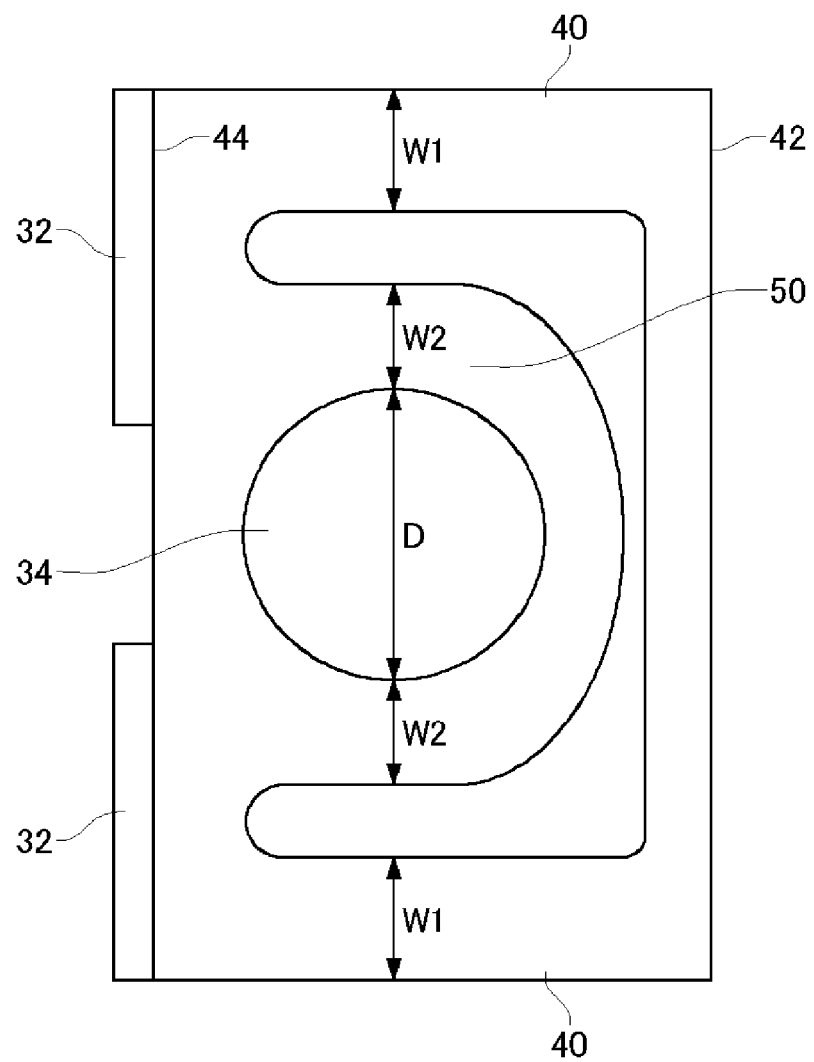
FIG. 6 illustrates the widths of a first extending portion 40 and a second extending portion 50.

FIG. 6 illustrates the widths of the first extending portions 40 and the second extending portion 50. Here, W1 denotes the width of each of the first extending portions 40 and W2 denotes the width of the second extending portion 50. In the present example, the width of the second extending portion 50 indicates the distance from the edge of the through hole 34 to the edge of the second extending portion 50. In other words, the second extending portion 50 having the width W2 is formed on each side of the through hole 34.

The width W1 of each first extending portion 40 may be larger than the width W2 of the second extending portion 50. With such a configuration, the first extending portions 40 are less likely to be bent and can thus efficiently transfer the force applied to the outer ends 44 to the case-side ends 42. The width W1 of each first extending portion 40 may be twice or more as large as the width W2 of the second extending portion 50. The diameter D of the through hole 34 may be larger than double the width W2 of the second extending portion 50.

Figure 7:
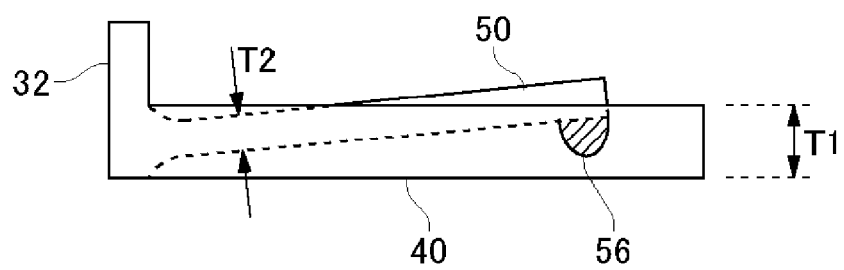
FIG. 7 is a side view showing another exemplary structure of the fastener 30.

FIG. 7 is a side view showing another exemplary structure of the fastener 30. In the present example, the thickness T1 of each first extending portion 40 is larger than the thickness T2 of the second extending portion 50. The second extending portion 50 may include a transition portion in which the thickness gradually changes from T1 to T2. With such a configuration, the first extending portions 40 are also less likely to be bent and can thus efficiently transfer the force applied to the outer ends 44 to the case-side ends 42.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10 . . . case, 12 . . . front surface, 14 . . . terminal, 16 . . . hole, 18 . . . back surface, 20 . . . side surface, 30 . . . fastener, 32 . . . reinforcing portion, 34 . . . through hole, 36 . . . separation hole, 38 . . . outer connecting portion, 40 . . . first extending portion, 41 . . . case-side connecting portion, 42 . . . case-side end, 44 . . . outer end, 50 . . . second extending portion, 52, . . . case-side end, 54 . . . outer end, 56 . . . projection, 100 . . . semiconductor module, 110 . . . heat sink, 120 . . . fixation element

The invention claimed is:

1. A semiconductor module comprising:
a case that houses a semiconductor device therein; and
a fastener that is connected at one end thereof to the case, wherein
the fastener includes:
a first extending portion that is connected at one end thereof to the case and extends away from the case; and
a second extending portion that has a first end connected to the first extending portion, and a second end extending toward the case, the second extending portion having a variable angle with respect to the first extending portion depending on an external force, and the second extending portion has:
a through hole that penetrates through the second extending portion from a front surface of the second extending portion to a back surface of the second extending portion; and
a projection that is provided on the back surface of the second extending portion, the projection being positioned closer to the case than the through hole is.

2. The semiconductor module as set forth in claim 1, wherein
the fastener is provided on each of side surfaces of the case that oppose each other.

3. The semiconductor module as set forth in claim 1, wherein
the through hole is spaced away from the projection.

4. The semiconductor module as set forth in claim 1, wherein
a case side end the second end of the second extending portion that is the closest to the case is a free end, and
the projection is provided on the case-side end of the second extending portion.

5. The semiconductor module as set forth in claim 1, wherein
the fastener has the first extending portion at each side of the second extending portion, and
the first end of the second extending portion that is the most distant from the case is connected to an outer end of the first extending portion at each side of the second extending portion.

6. The semiconductor module as set forth in claim 5, wherein
the fastener further has a reinforcing portion at a connecting portion between the first extending portion and the second extending portion, and the reinforcing portion has a larger thickness than other portions of the fastener.

7. The semiconductor module as set forth in claim 6, wherein
the reinforcing portion is provided at least in a partial region of the outer end of the first extending portion and not provided at least in a partial region of the outer end of the second extending portion.

8. The semiconductor module as set forth in claim 1, wherein
a back surface of the fastener is positioned between a front surface of the case and a back surface of the case.

9. The semiconductor module as set forth in claim 8, wherein
a tip of the projection is positioned between the front surface of the case and the back surface of the case.

10. The semiconductor module as set forth in claim 1, wherein
the first extending portion is wider than the second extending portion.

11. The semiconductor module as set forth in claim 1, wherein
the first extending portion has a larger thickness than the second extending portion.

12. The semiconductor module as set forth in claim 1, further comprising:
a heat sink that has the case placed thereon; and
a fixation element that penetrates through the through hole of the second extending portion and secures the second extending portion onto the heat sink.

13. The semiconductor module as set forth in claim 1, wherein the projection is provided on the back surface that faces a heat sink.

14. The semiconductor module as set forth in claim 1, wherein the size of the projection is smaller than the size of the through hole.

\* \* \* \* \*